(12) United States Patent
Kurata et al.

(10) Patent No.: US 7,639,559 B2
(45) Date of Patent: Dec. 29, 2009

(54) SEMICONDUCTOR MEMORY DEVICE

(75) Inventors: Masakazu Kurata, Osaka (JP);
Mitsuaki Hayashi, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/686,892

(22) Filed: Mar. 15, 2007

(65) Prior Publication Data
US 2007/0217246 A1 Sep. 20, 2007

(30) Foreign Application Priority Data
Mar. 16, 2006 (JP) .............................. 2006-072899

(51) Int. Cl.
*G11C 8/00* (2006.01)
(52) U.S. Cl. ............... 365/230.06; 365/94; 365/230.03; 365/103; 365/104
(58) Field of Classification Search ............... 365/94, 365/230.03, 230.06, 103, 104; 257/390
See application file for complete search history.

(56) References Cited

U.S. PATENT DOCUMENTS 5,757,709 A    5/1998  Suminaga et al.
5,886,937 A    3/1999  Jang
2004/0151033 A1 * 8/2004  Takazawa et al. ...... 365/189.09
2006/0120201 A1  6/2006  Kurata et al.

FOREIGN PATENT DOCUMENTS

JP            836895        2/1996

* cited by examiner

*Primary Examiner*—Hoai V Ho
*Assistant Examiner*—Fernando N Hidalgo
(74) *Attorney, Agent, or Firm*—Dickinson Wright PLLC

(57) ABSTRACT

In a conventional semiconductor memory device, a replica circuit configured by using a dummy bit line has been unable to charge the dummy bit line to a desired potential due to off leak current. Consequently, the time required for charging or discharging the dummy bit line differs from the desired time, and therefore, it has been unable to set optimum operation timing. To solve these problems, a semiconductor memory device of the present invention includes a dummy memory cell array in which source lines of dummy memory cells are charged simultaneously by a charge circuit configured similarly to a dummy bit line charge circuit, thus suppressing off leak current and performing appropriate timing generation.

3 Claims, 9 Drawing Sheets

SEMICONDUCTOR MEMORY DEVICE

BACKGROUND OF THE INVENTION

1. Field of the Invention

The present invention relates to a semiconductor memory device such as a mask ROM.

2. Prior Art

A conventional semiconductor memory device such as a mask ROM utilizes, as a method for reducing current consumption, a replica circuit having a dummy sense amplifier circuit and a dummy memory cell circuit, which are configured similarly to a normal sense amplifier circuit and a normal memory cell circuit, in order to control an appropriate read operation time. Hereinafter, an operation method for a replica circuit in a conventional mask ROM will be described with reference to the drawings.

FIG. 8 is a diagram showing a read circuit of a conventional mask ROM. A sense amplifier circuit 1 includes: a p-type transistor 2 whose gate input receives a pre-charge signal NPR; an n-type transistor 3 coupled in series to the p-type transistor 2; an inverter 4 whose input is coupled to a source node SA of the n-type transistor 3 and whose output is coupled to a gate input of the n-type transistor 3; an inverter chain 5, an input of which is coupled to the source node SA, and from which an output SOUT0 is outputted; and a charge circuit 6, to which the pre-charge signal NPR is inputted, and an output of which is coupled to the source node SA.

The charge circuit 6 includes a p-type transistor 6(1) and an n-type transistor 6(2). A column gate 7 includes: an n number of n-type transistors 8(1) through 8(n), gate inputs of which receive column selection signals CL1 through CLn, and which are connected between the source node SA and bit lines BL1 through BLn.

A memory cell array 9 includes memory cells 10(1,1) through 10(n, m) arranged in an array, which have gate inputs coupled to word lines WL1 through WLm, and sources each coupled to a ground potential. Whether drains of these memory cells are coupled to the bit lines or not is decided during manufacturing process depending upon data to be stored. In this conventional device, the drains of all the memory cells are coupled to the bit lines. A Y address signal ADY is inputted to a column selection circuit 16, from which column selection signals CL1 through CLn are outputted. An X address signal ADX is inputted to a row selection circuit 17, outputs of which are coupled to the word lines WL1 through WLm.

In a timing generation circuit 21, a dummy sense amplifier circuit 11 is configured similarly to the sense amplifier circuit 1. A dummy column gate 12 includes a transistor 13(1), a gate input of which is coupled to a power supply, and which is configured similarly to those in the column gate 7. A dummy memory cell array 14 includes dummy memory cells 15(1) through 15(m), gate inputs of which are each coupled to a ground potential, which are coupled to a dummy bit line DBL1, and which are configured similarly to the memory cells 10. An external clock signal CLK and an output from an inverter 20 are inputted to an NAND gate 18, from which the pre-charge signal NPR is outputted. An output SOUTD from the dummy sense amplifier circuit 11 is inputted to the inverter 20. The clock signal CLK is inputted to an inverter 19, from which a pre-charge signal NDPR is outputted to the dummy sense amplifier circuit 11.

Next, an operation of the read circuit shown in FIG. 8 will be described with reference to a timing chart shown in FIG. 9. When the external clock signal CLK has been changed from "L" level to "H" level at a time point t0, the level of the pre-charge signal NPR sent from the NAND gate 18 becomes "L" level. Thus, the p-type transistor 2 is turned ON, and the p-type transistor 6(1) of the charge circuit 6 is also turned ON, and therefore, the source node SA is charged. However, drains of memory cells selected by column selection signals CL1 through CLn selected by a column selection circuit 16 and selected via word lines WL1 through WLm selected by a row selection circuit 17 are coupled to the associated bit lines; therefore, the level of the source node SA will not be charged until the determination level of the inverter chain 5 (i.e., sense amplifier determination level), and thus the output SOUT0 with "L" level is outputted. In such a case, during a time period when the pre-charge signal NPR is at "L" level, a through current is kept flowing through the memory cells 10.

Similarly, when the external clock signal CLK has been changed from "L" level to "H" level at the time point t0, the level of the pre-charge signal NDPR sent from the inverter 19 becomes "L" level, and the dummy source node DSA is charged. All the dummy memory cells 15(1) through 15(m) are coupled to the dummy bit line DBL1, and all the dummy word lines are each fixed to a ground potential; therefore, the level of the dummy source node DSA will be charged until the determination level of the inverter chain (i.e., sense amplifier determination level), and thus the output SOUTD with "H" level is outputted. Since the output SOUTD is inputted to the NAND gate 18 via the inverter 20, the level of the pre-charge signal NPR is changed to "H" level to turn the p-type transistor 2 OFF, thus stopping the through current. As a result, the potential of the source node is decreased. Accordingly, the output SOUT is kept at "L" level.

At a time point t100, when the external clock signal CLK has been changed from "H" level to "L" Level, the level of the pre-charge signal NDPR is changed to "H" level, and the potential of the dummy source node DSA is decreased.

As described above, since there is provided the replica circuit that utilizes the dummy memory cells and dummy sense amplifier configured similarly to the normal memory cells and sense amplifier circuit, an appropriate timing can be obtained during the sense amplifier operation time period (see, for example, Japanese Unexamined Patent Publication NO. 08-036895).

However, in recent years, transistor off leak current has been significantly increased due to miniaturization in manufacturing technologies, and therefore, the conventional replica circuit presents a first problem as follows. Since the conventional replica circuit utilizes the dummy bit line to which all the dummy memory cells are coupled, a current supplied from the charge circuit to the dummy bit line becomes insufficient, and thus it becomes impossible to charge the dummy bit line to a predetermined potential and to ensure a desired timing margin. Furthermore, the conventional replica circuit presents a second problem as follows. Due to memory cell off leak current, the charging of the bit line is delayed to cause an access delay, or data output of the sense amplifier becomes later than the timing generated by the replica circuit to cause an erroneous reading.

SUMMARY OF THE INVENTION

An object of the present invention is to provide a semiconductor memory device capable of suppressing off leak current to ensure a timing margin or to prevent an access delay.

To solve the above-described problems, a semiconductor memory device of the present invention includes:

a first memory cell array provided by arranging a plurality of first memory cells for a memory capacity in a matrix along a bit line direction and along a word line direction;

a column selection circuit and a row selection circuit for selecting, in response to an address input, a first bit line and a word line of the first memory cell array, respectively;

a first bit line charge circuit for charging the first bit line selected by the column selection circuit;

a second memory cell array having a group of at least two second bit lines, and having a plurality of second memory cells arranged along a direction of the second bit line group, the second memory cells each having a drain coupled to at least one second bit line of the second bit line group, a source coupled to the other second bit line, and a gate to which a predetermined voltage is applied;

a second bit line charge circuit for charging the bit line to which the drains of the second memory cell array are coupled; and a third bit line charge circuit for charging the bit line to which the sources of the second memory cell array are coupled, wherein the bit line to which the drains of the second memory cell array are coupled, and the bit line to which the sources of the second memory cell array are coupled are charged substantially simultaneously.

In the above-described configuration, the memory cells are arranged along one bit line and other bit line in the second memory cell array, the number of the memory cells coupled to said other bit line coupled to the sources of the memory cells arranged along said one bit line being equal to or less than the number of the memory cells arranged along said one bit line.

Another semiconductor memory device of the present invention includes:

a first memory cell array provided by arranging a plurality of first memory cells for a memory capacity in a matrix along a bit line direction and along a word line direction;

a column selection circuit and a row selection circuit for selecting, in response to an address input, a first bit line and a word line of the first memory cell array, respectively;

a first bit line charge circuit for charging the first bit line selected by the column selection circuit;

a second memory cell array having second memory cells arranged along the bit line direction of the first memory cell array, and having a second bit line to which drains and sources of the second memory cells are commonly coupled; and a second bit line charge circuit for charging the second bit line of the second memory cell array.

Still another semiconductor memory device of the present invention includes:

a memory cell array having a bit line and a word line, and is provided by arranging a plurality of memory cells, whose drains are coupled to the bit line and whose gates are coupled to the word line, for a memory capacity in a matrix along a bit line direction and along a word line direction;

a column selection circuit and a row selection circuit for selecting, in response to an address input, the bit line and the word line of the memory cell array, respectively;

a bit line charge circuit for charging the bit line selected by the column selection circuit;

a source line charge circuit for charging and activating a source line coupled to sources of the memory cells; and a control circuit for deactivating the source line of the memory cell selected in response to the address input, and for activating the source line of the memory cell that is not selected, wherein the bit line and the source line of the memory cell, which is not selected, are charged simultaneously.

Still yet another semiconductor memory device of the present invention includes:

a memory cell array having a first bit line and a word line, and is provided by arranging a plurality of memory cells, whose drains are coupled to the first bit line and whose gates are coupled to the word line, for a memory capacity in a matrix along a bit line direction and along a word line direction;

a column selection circuit and a row selection circuit for selecting, in response to an address input, the first bit line and the word line of the memory cell array, respectively;

a first bit line charge circuit for charging the first bit line selected by the column selection circuit;

a bit line array having a second bit line that is equal in number to the first bit line of the memory cell array, and that is coupled to sources of the memory cells, the number of the bit line arrays being in accordance with the number of the memory cells coupled to the same first bit line;

a second column selection circuit for selecting the second bit line of the bit line array;

a second bit line charge circuit for charging the second bit line selected by the second column selection circuit; and a control circuit for activating the second bit line charge circuit coupled to the second bit line to which the source of the memory cell that is not selected by the row selection circuit is coupled, and for deactivating the second bit line charge circuit coupled to the second bit line to which the source of the memory cell selected by the row selection circuit is coupled, wherein the first bit line and the second bit line of the memory cell, which is not selected, are charged simultaneously.

Another semiconductor memory device of the present invention includes:

a memory cell array having a first bit line and a word line, and is provided by arranging a plurality of memory cells, whose drains are coupled to the first bit line and whose gates are coupled to the word line, for a memory capacity in a matrix along a bit line direction and along a word line direction;

a column selection circuit and a row selection circuit for selecting, in response to an address input, the first bit line and the word line of the memory cell array, respectively;

a first bit line charge circuit for charging the first bit line selected by the column selection circuit;

a bit line array having a second bit line that is equal in number to the first bit line of the memory cell array, and that is commonly coupled to sources of a plurality of the memory cells coupled to the same first bit line;

a second column selection circuit for selecting the second bit line of the bit line array;

a second bit line charge circuit for charging the second bit line selected by the second column selection circuit; and a control circuit for activating the second bit line charge circuit coupled to the second bit line to which the source of the memory cell that is not selected by the row selection circuit is coupled, and for deactivating the second bit line charge circuit coupled to the second bit line to which the source of the memory cell selected by the row selection circuit is coupled, wherein the first bit line and the second bit line of the memory cell, which is not selected, are charged simultaneously.

Still another semiconductor memory device of the present invention includes:

a memory cell array having a first bit line and a word line, and is provided by arranging a plurality of memory cells, whose drains are coupled to the first bit line and whose gates are coupled to the word line, for a memory capacity in a matrix along a bit line direction and along a word line direction;

a column selection circuit and a row selection circuit for selecting, in response to an address input, the first bit line and the word line of the memory cell array, respectively;

a first bit line charge circuit for charging the first bit line selected by the column selection circuit;

a bit line array having a second bit line coupled to sources of the memory cells arranged on the same word line of the memory cell array, the number of the bit line arrays being in accordance with the number of the memory cells coupled to the same first bit line;

a second bit line charge circuit for charging the second bit line; and a control circuit for activating the second bit line charge circuit coupled to the second bit line to which the source of the memory cell that is not selected by the row selection circuit is coupled, and for deactivating the second bit line charge circuit coupled to the second bit line to which the source of the memory cell selected by the row selection circuit is coupled, wherein the first bit line and the second bit line of the memory cell, which is not selected, are charged simultaneously.

Still yet another semiconductor memory device of the present invention includes:

a memory cell array having a first bit line and a word line, and is provided by arranging a plurality of memory cells, whose drains are coupled to the first bit line and whose gates are coupled to the word line, for a memory capacity in a matrix along a bit line direction and along a word line direction;

a column selection circuit and a row selection circuit for selecting, in response to an address input, the first bit line and the word line of the memory cell array, respectively;

a first bit line charge circuit for charging the first bit line selected by the column selection circuit;

a plurality of bit line arrays having second bit lines commonly coupled to sources of the memory cells arranged on the same word line or a plurality of the word lines of the memory cell array;

a second bit line charge circuit for charging the second bit line; and a control circuit for activating the second bit line charge circuit coupled to the second bit line to which the source of the memory cell that is not selected by the row selection circuit is coupled, and for deactivating the second bit line charge circuit coupled to the second bit line to which the source of the memory cell selected by the row selection circuit is coupled, wherein the first bit line and the second bit line of the memory cell, which is not selected, are charged simultaneously.

In the above-described configurations, the number of memory cells arranged along the second bit line of the bit line array is equal to or less than the number of the memory cells arranged along the first bit line of the memory cell array.

Thus, a semiconductor memory device of the present invention suppresses the off leak current of a dummy memory cell, thereby allowing a charge circuit to supply sufficient current to a dummy bit line so that the dummy bit line can be charged to a predetermined potential and a desired timing margin can be ensured.

Furthermore, another semiconductor memory device of the present invention suppresses the off leak current of a memory cell, thereby making it possible to realize a high speed access.

DESCRIPTION OF THE PREFERRED EMBODIMENTS

Hereinafter, embodiments of the present invention will be described with reference to the drawings.

Figure 1:
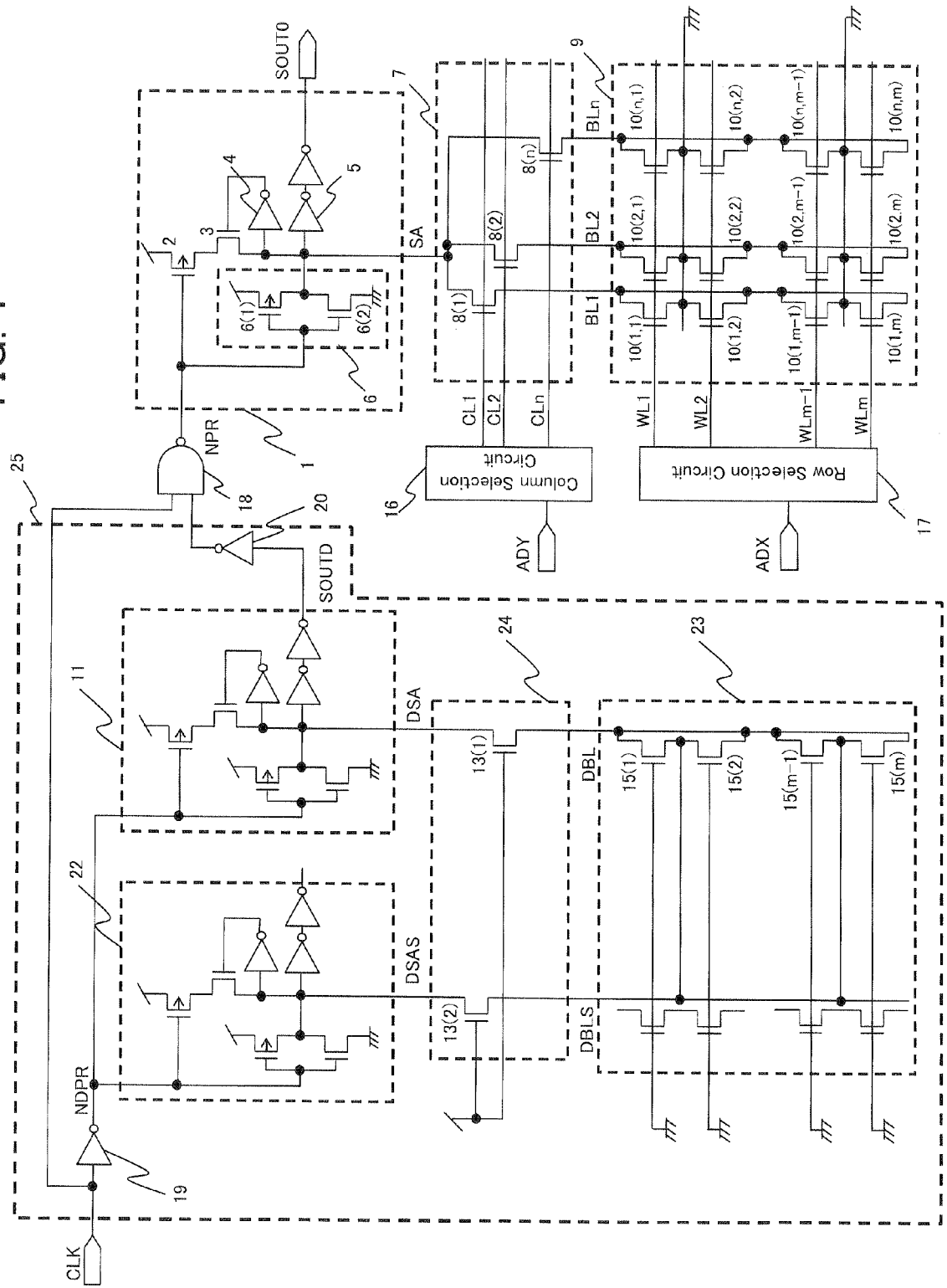
FIG. 1 is a circuit diagram showing a configuration of a read circuit of a mask ROM in Embodiment 1 of the present invention.
Figure 8:
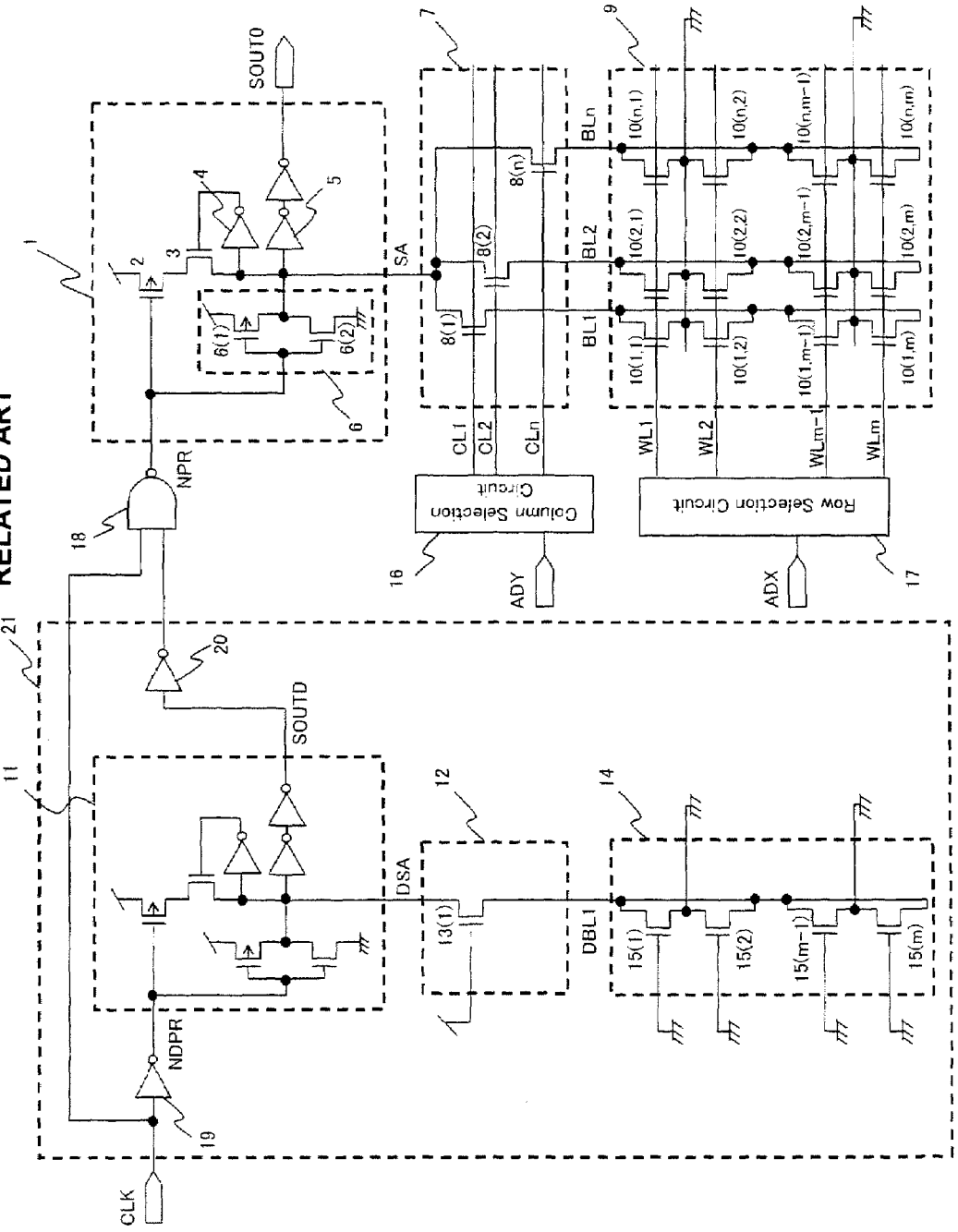
FIG. 8 is a circuit diagram showing a configuration of a read circuit of a conventional mask ROM.
Figure 9:
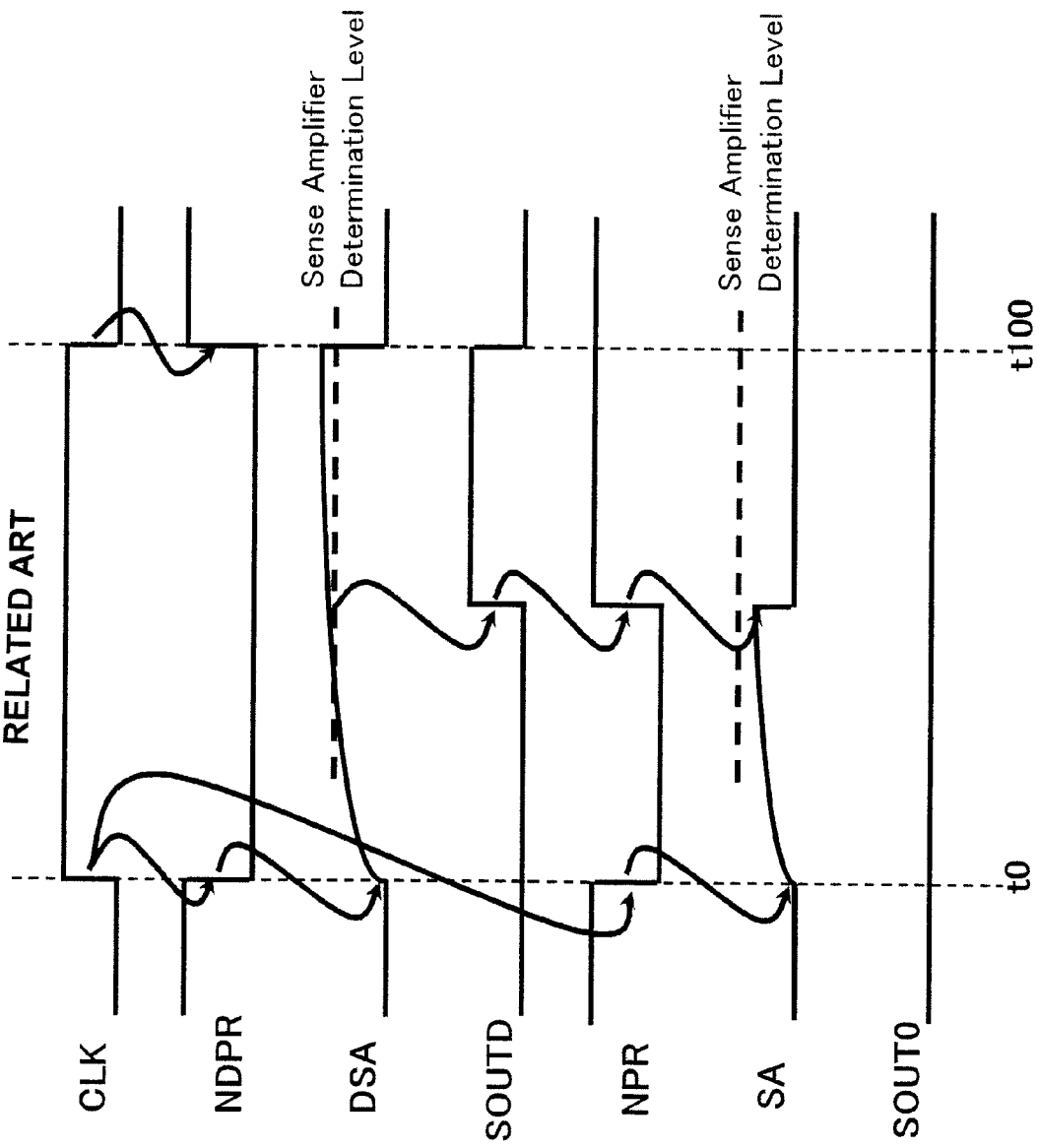
FIG. 9 is a timing chart of the conventional mask ROM.

A semiconductor memory device according to Embodiment 1 of the present invention will be described with reference to FIG. 1. FIG. 1 is a circuit diagram showing a configuration of a read circuit of a mask ROM in Embodiment 1. In FIG. 1, the constituent elements denoted by the same reference characters as those in FIG. 8 function similarly, and therefore, only different constituent elements will be described below.

In a timing generation circuit 25, a dummy sense amplifier circuit 22 is configured similarly to a sense amplifier circuit 1. A dummy column gate 24 includes a transistor 13(1) and a transistor 13(2), gate inputs of which are coupled to a power supply, and which are configured similarly to those in a column gate 7. A dummy memory cell array 23 includes dummy memory cells 15(1) through 15(m), and sources of the dummy memory cells 15(1) through 15(m) are coupled to a source control line DBLS equivalent to a bit line provided separately from a dummy bit line DBL.

Figure 2:
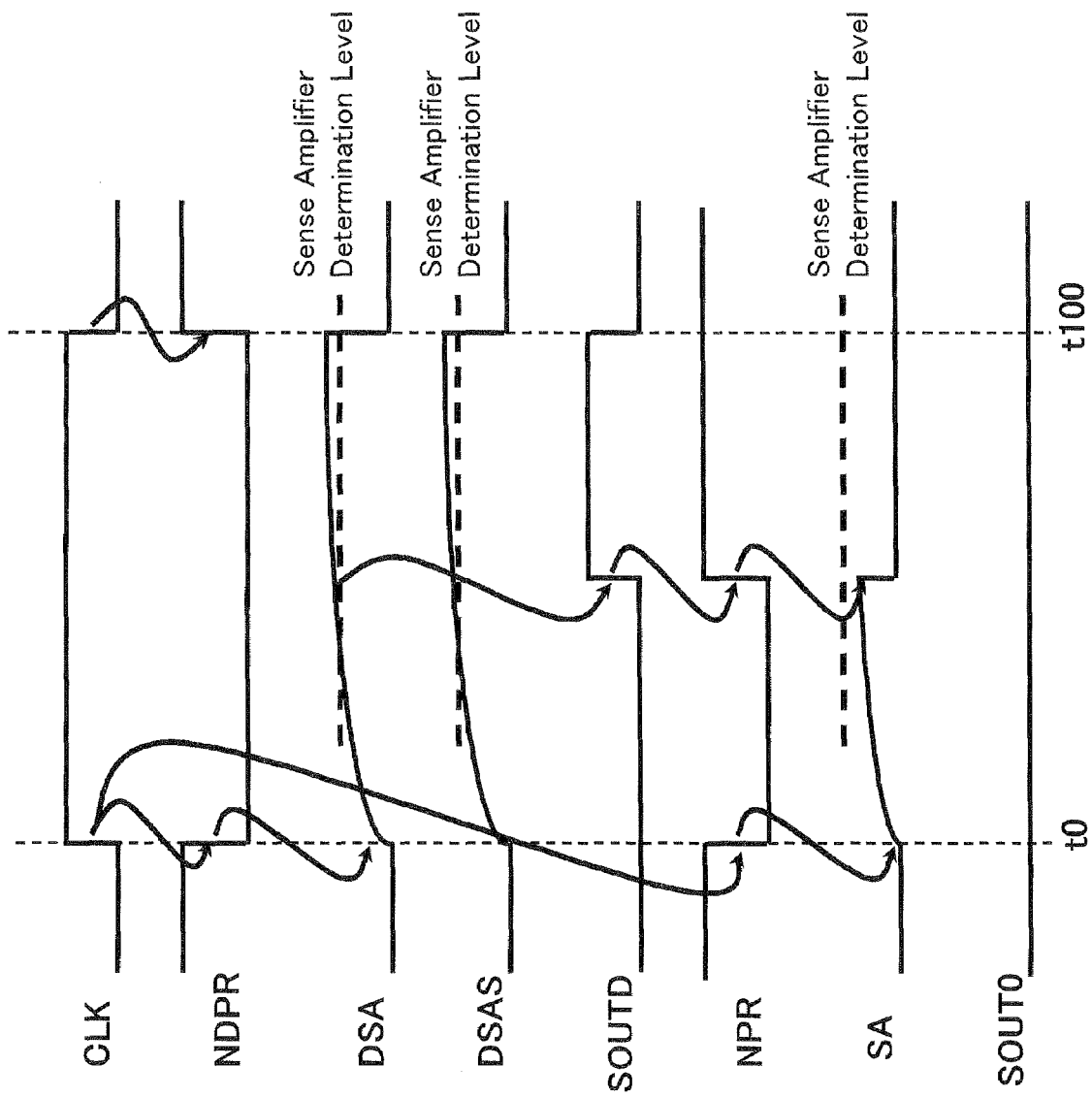
FIG. 2 is a timing chart of the mask ROM in Embodiment 1 of the present invention.

Next, an operation of the read circuit shown in FIG. 1 will be described with reference to a timing chart shown in FIG. 2. When an external clock signal CLK has been changed from "L" level to "H" level at a time point to, the level of a precharge signal NPR sent from an NAND gate 18 becomes "L" level. Thus, a p-type transistor 2 is turned ON, and a source node SA is charged. However, drains of memory cells selected by column selection signals CL1 through CLn selected by a column selection circuit 16 and selected via word lines WL1 through WLm selected by a row selection circuit 17 are coupled to the associated bit lines; therefore, the level of the source node SA will not be charged until the determination level of an inverter chain 5 (i.e., sense amplifier determination level), and thus an output SOUT0 with "L" level is outputted. In such a case, during a time period when the pre-charge signal NPR is at "L" level, a through current is kept flowing through memory cells 10. Similarly, when the external clock signal CLK has been changed from "L" level to "H" level at the time point t0, the level of a pre-charge signal NDPR sent from an inverter 19 becomes "L" level, and a dummy source node DSA is charged by a dummy sense amplifier circuit 11; at the same time, the node DSAS is charged by the dummy sense amplifier circuit 22. All the dummy memory cells 15(1) through 15(m) are coupled to the dummy bit line DBL, and all dummy word lines are each fixed to a ground potential, thus; the source control line DBLS coupled to the sources of the dummy memory cells 15(1) through 15(m) are charged simultaneously with the dummy bit line DBL. Therefore, the level of the dummy source node DSA is charged until the determination level of the inverter chain (i.e., sense amplifier determination level) without causing any off leak current attributed to the dummy memory cells 15(1) through 15(m), and an output SOUTD with "H" level is outputted. Since the output SOUTD is inputted to the NAND gate 18 via the inverter 20, the level of the pre-charge signal NPR is changed to "H" level to turn the p-type transistor 2 OFF, thus stopping the through current. As a result, the potential of the source node SA is decreased. Accordingly, an output SOUT is kept at "L" level.

At a time point t100, when the external clock signal CLK has been changed from "H" level to "L" Level, the level of the pre-charge signal NDPR is changed to "H" level, and the potential of the dummy source node DSA is decreased.

As described above, since there is no adverse influence of the off leak current of the dummy memory cells, the charge potential of the dummy bit line can be made equivalent to that of a normal bit line in a memory array, thus enabling optimum timing generation.

It should be noted that, similarly to the normal bit line, the source control line DBLS can form a memory cell pattern, and can adjust timing in accordance with the number of the coupled memory cells. In this case, the number of the memory cells arranged along the source control line DBLS, connected to the sources of the memory cells 15 arranged along the dummy bit line DBL in the dummy memory cell array 23, is preferably equal to or less than the number of the memory cells arranged along the dummy bit line DBL.

Further, there may be provided a plurality of the sense amplifiers 1, each serving as a bit line charge circuit, and a plurality of the sense amplifiers 1 may be coupled to bit lines BL of the column selection circuit 16 to respectively charge a plurality of the bit lines BL selected by the column selection circuit 16.

Furthermore, a column selection circuit may be provided for the dummy column gate 24 of the dummy memory cell array 23.

Figure 3:
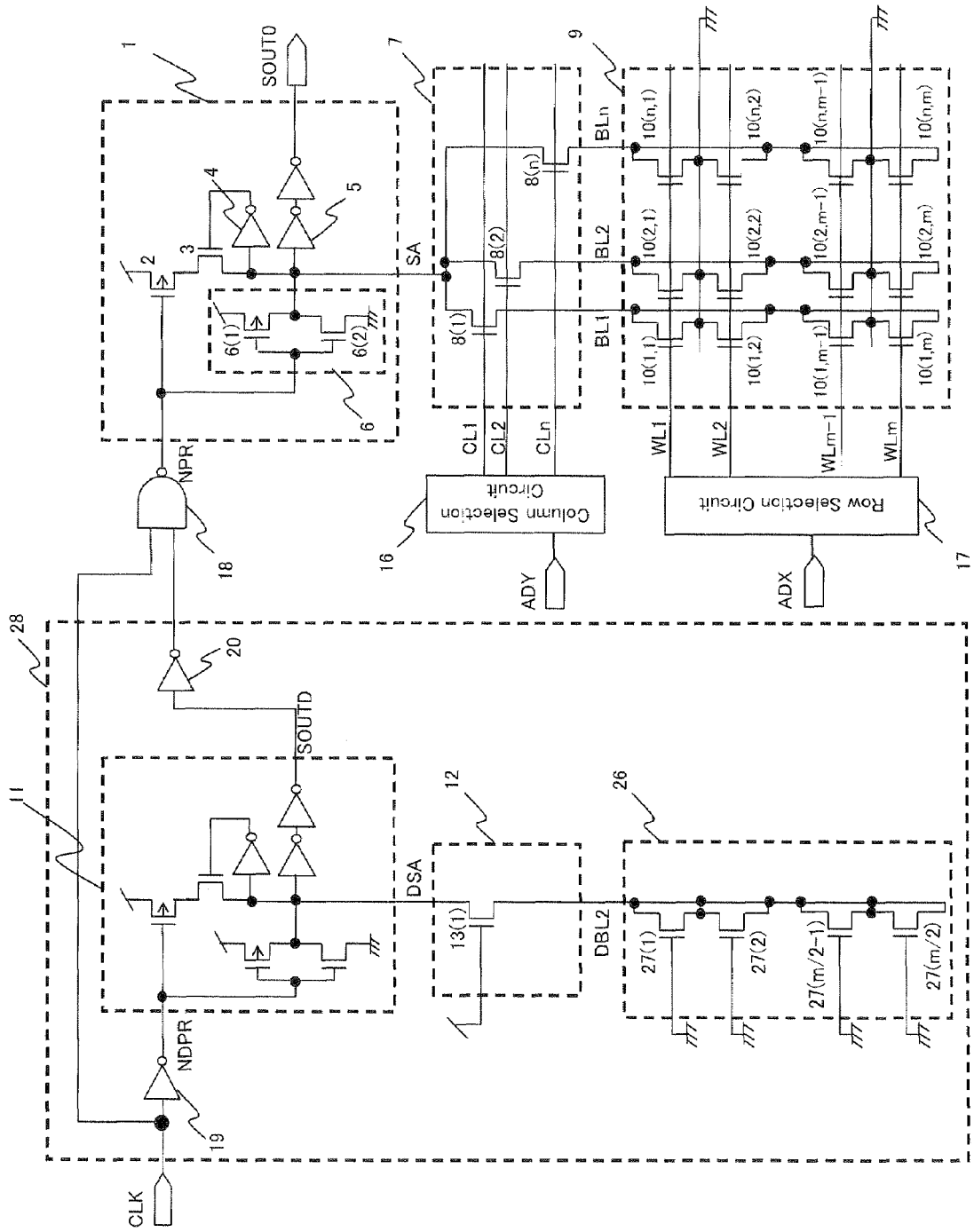
FIG. 3 is a circuit diagram showing a configuration of a read circuit of a mask ROM in Embodiment 2 of the present invention.

A semiconductor memory device according to Embodiment 2 of the present invention will be described with reference to FIG. 3. FIG. 3 is a circuit diagram showing a configuration of a read circuit of a mask ROM in Embodiment 2. In FIG. 3, the constituent elements denoted by the same reference characters as those in FIG. 8 function similarly, and therefore, only different constituent elements will be described below.

In a timing generation circuit 28, a dummy memory cell array 26 includes dummy memory cells 27(1) through 27(m/2), and the number of the dummy memory cells 27(1) through 27(m/2) constituting the dummy memory cell array 26 is half the m number of memory cells provided for one normal bit line. Drains and sources of the dummy memory cells 27(1) through 27(m/2) are coupled to a source control line (i.e., dummy bit line) DBL2.

In the above-described configuration, since there is no adverse influence of the off leak current of the dummy memory cells, the charge potential of the dummy bit line can be made equivalent to that of a normal bit line in a memory array, thus enabling optimum timing generation.

It should be noted that a column selection circuit may be provided for a dummy column gate 12 of the dummy memory cell array 26.

Figure 4:
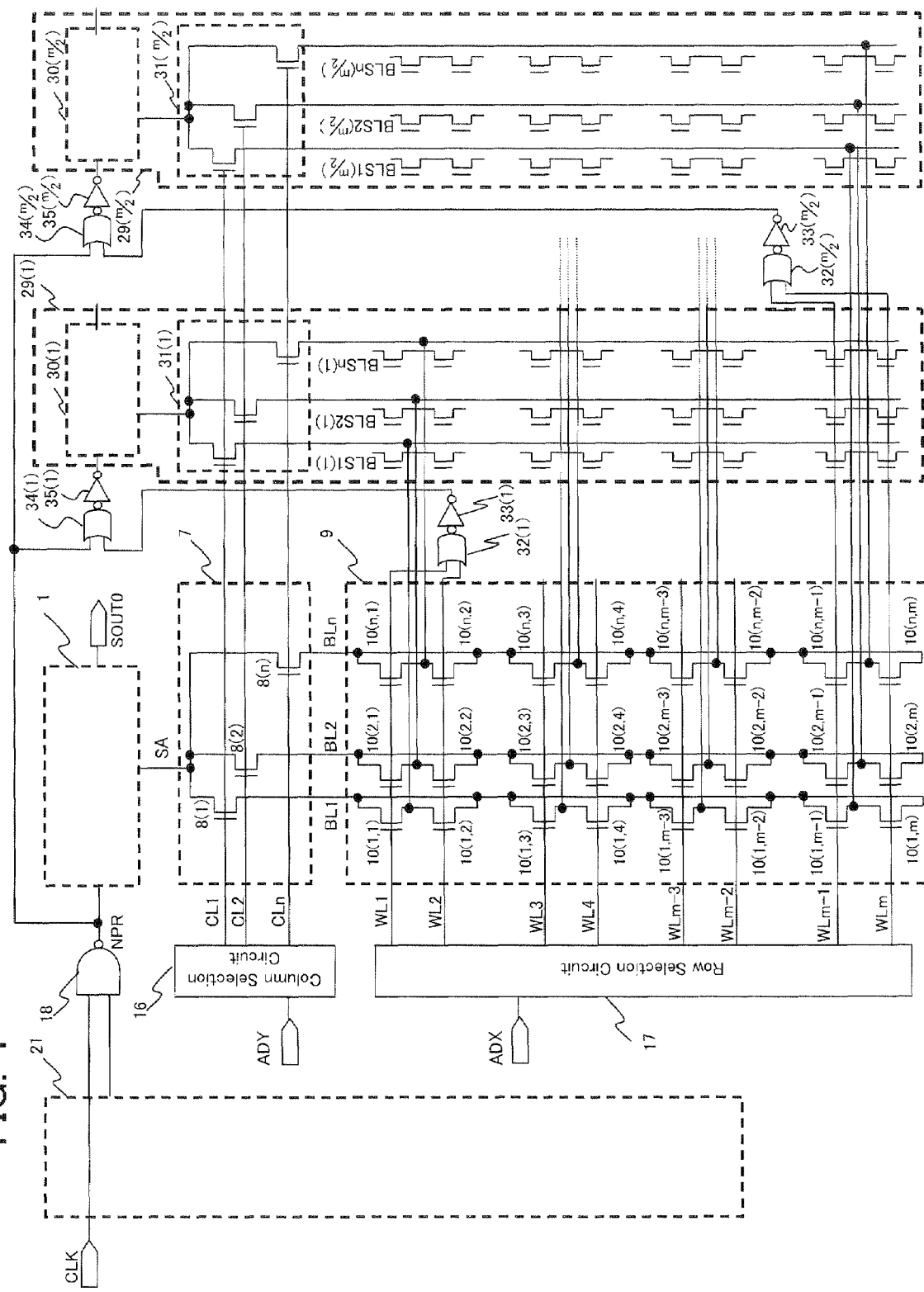
FIG. 4 is a circuit diagram showing a configuration of a read circuit of a mask ROM in Embodiment 3 of the present invention.

A semiconductor memory device according to Embodiment 3 of the present invention will be described with reference to FIG. 4. FIG. 4 is a circuit diagram showing a configuration of a read circuit of a mask ROM in Embodiment 3. In FIG. 4, the constituent elements denoted by the same reference characters as those in FIG. 8 function similarly, and therefore, only different constituent elements will be described below.

Source potential control circuits 29(1) through 29(m/2) include: sense amplifier circuits 30(1) through 30(m/2) each configured similarly to a sense amplifier circuit 1; column gates 31(1) through 31(m/2) each configured similarly to a column gate 7; bit line arrays having source control lines (i.e., bit lines) coupled to the associated column gates; and control circuits for controlling the sense amplifier circuits. Nodes BLS1(1) through BLSn(m/2), controlled by the sense amplifier circuits 30(1) through 30(m/2) and the column gates 31(1) through 31(m/2), are coupled to a common source node of a memory cell 10(1, 1) and a memory cell 10(1, 2) through a common source node of a memory cell 10(n, m-1) and a memory cell 10(n, m). An OR logic of an OR logic of word lines WL1, WL2 and a pre-charge signal NPR through an OR logic of an OR logic of word lines WLm-1, WLm and the pre-charge signal NPR are inputted to the sense amplifier circuits 30(1) through 30 (m/2) by means of NOR gates 32(1) through 32(m/2), inverters 33(1) through 33(m/2), NOR gates 34(1) through 34(m/2), and inverters 35(1) through 35(m/2) which constitute the control circuits.

In the above-described configuration, the source(s) of the selected memory cell(s) is/are controlled to "L" level, while the source(s) of the non-selected memory cell (s) is/are controlled to "H" level. Thus, since the off leak current of the non-selected memory cell(s) can be suppressed, the bit lines can be charged at a high speed, thereby enabling a high speed access.

It should be noted that, similarly to the normal bit lines, the source control lines (i.e., bit lines) BLS1(1) through BLSn (m/2) form a memory cell pattern for a memory cell array, and can adjust timing in accordance with the number of the coupled memory cells.

Moreover, although the number of the source potential control circuits is half the number of the memory cells coupled to the same bit line in the present embodiment, the number of the source potential control circuits to be provided may alternatively be equal to the number of the memory cells coupled to the same bit line.

Figure 5:
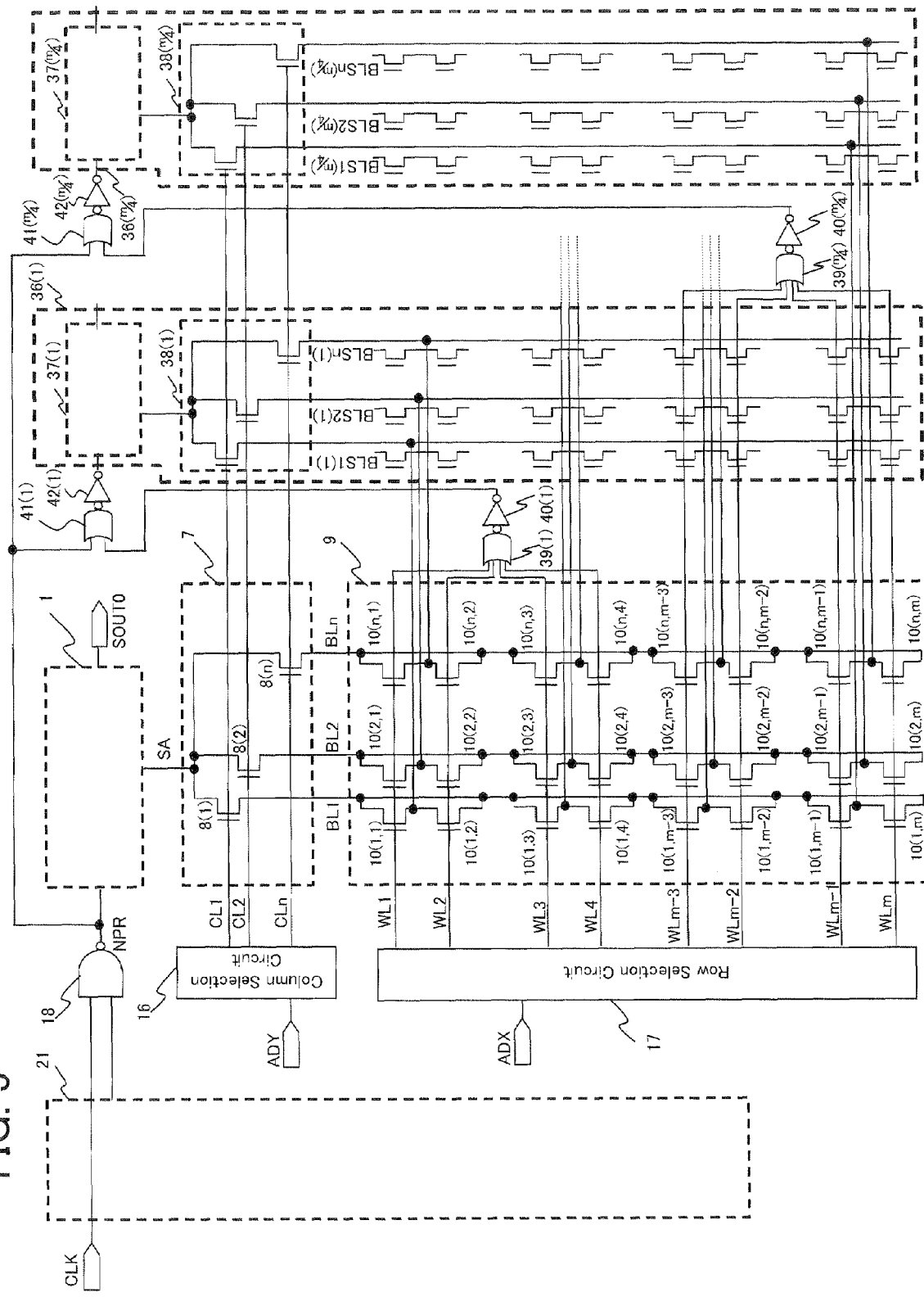
FIG. 5 is a circuit diagram showing a configuration of a read circuit of a mask ROM in Embodiment 4 of the present invention.

A semiconductor memory device according to Embodiment 4 of the present invention will be described with reference to FIG. 5. FIG. 5 is a circuit diagram showing a configuration of a read circuit of a mask ROM in Embodiment 4. In FIG. 5, the constituent elements denoted by the same reference characters as those in FIG. 4 function similarly, and therefore, only different constituent elements will be described below.

Source potential control circuits 36(1) through 36(m/4) include: sense amplifier circuits 37(1) through 37(m/4) each configured similarly to a sense amplifier circuit 1; column gates 38(1) through 38(m/4) each configured similarly to a column gate 7; bit line arrays having source control lines (i.e., bit lines) coupled to the associated column gates; and control circuits for controlling the sense amplifier circuits. Bit lines (i.e., nodes) BLS1(1) through BLSn(m/4), controlled by the sense amplifier circuits 37(1) through 37(m/4) and the column gates 38(1) through 38(m/4), are coupled to sources of a memory cell 10(1, 1), a memory cell 10 (1, 2), a memory cell 10(1, 3) and a memory cell (1, 4) through sources of a memory cell 10(n , m-3), a memory cell 10 (n, m-2), a memory cell 10 (n, m-1) and a memory cell (n, m). An OR logic of an OR logic of word lines WL1, WL2, WL3, WL4 and a pre-charge signal NPR through an OR logic of an OR logic of word lines WLm-3, WLm-2, WLm-1, WLm and the pre-charge signal NPR are inputted to the sense amplifier circuits 37(1) through 37(m/4) by means of NOR gates 39(1) through 39(m/4), inverters 40(1) through 40(m/4), NOR gates 41(1) through 41(m/4), and inverters 42(1) through 42(m/4) which constitute the control circuits.

In the above-described configuration, the source(s) of the memory cell array(s) including the selected memory cell(s) is/are controlled to "L" level, while the source(s) of all the non-selected memory cell array(s) is/are controlled to "H" level. Thus, since the off leak current of the non-selected memory cell array(s) can be suppressed with a small-size circuit configuration, a high speed access due to a high speed charging of the bit lines is enabled with a small area.

It should be noted that, similarly to the normal bit lines, the source control lines (i.e., bit lines) BLS1(1) through BLSn (m/4) form a memory cell pattern, and can adjust timing in accordance with the number of the coupled memory cells.

Figure 6:
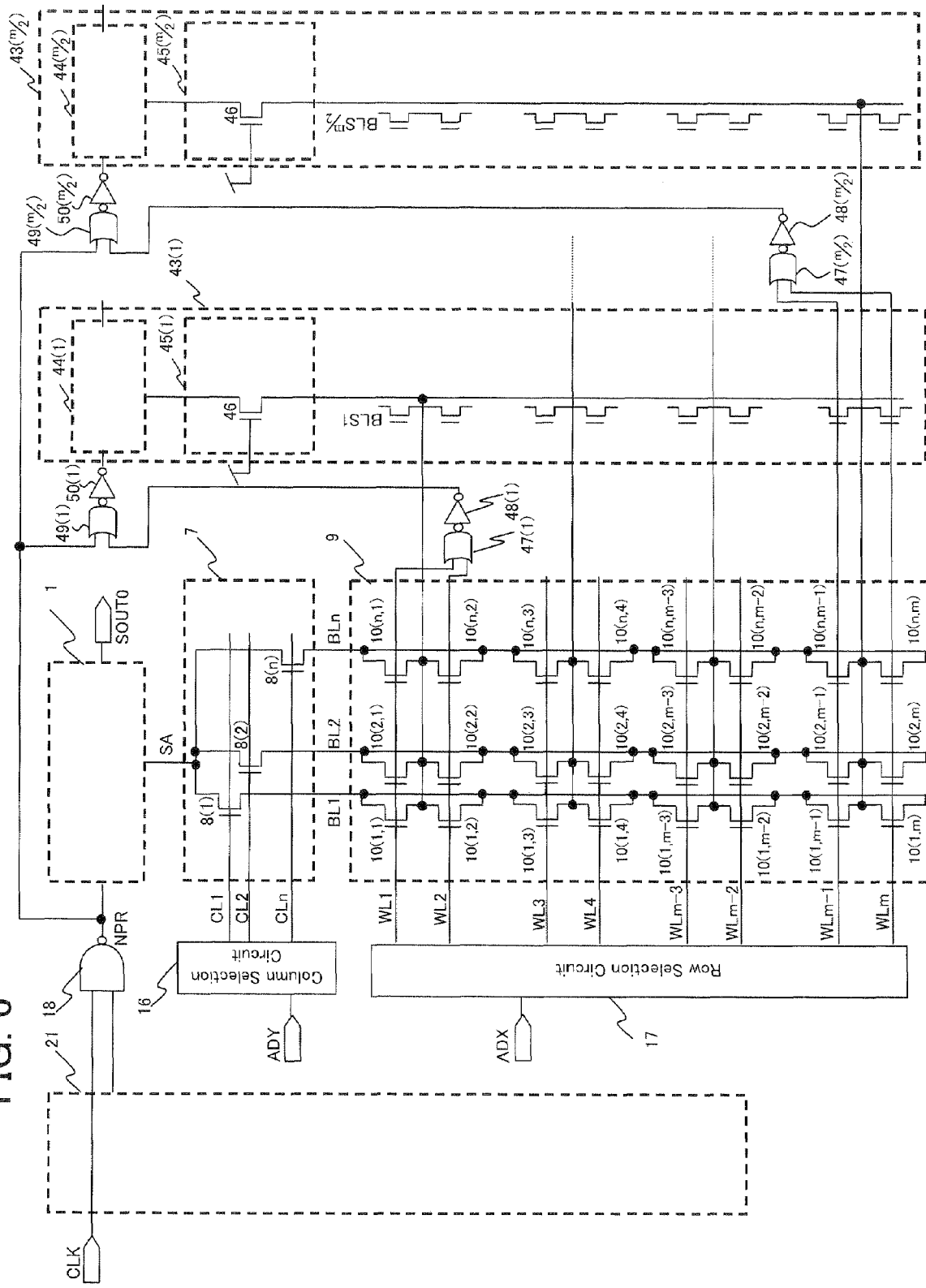
FIG. 6 is a circuit diagram showing a configuration of a read circuit of a mask ROM in Embodiment 5 of the present invention.

A semiconductor memory device according to Embodiment 5 of the present invention will be described with reference to FIG. 6. FIG. 6 is a circuit diagram showing a configuration of a read circuit of a mask ROM in Embodiment 5. In FIG. 5, the constituent elements denoted by the same reference characters as those in FIG. 4 function similarly, and therefore, only different constituent elements will be described below.

Source potential control circuits 43(1) through 43(m/2) include: sense amplifier circuits 44(1) through 44(m/2) each configured similarly to a sense amplifier circuit 1; and column gates 45(1) through 45(m/2) each including a transistor 46 whose configuration is similar to that of a transistor in a column gate 7 and whose gate input is coupled to a power supply. Source control lines (i.e., bit lines) BLS1 through BLSm/2, controlled by the sense amplifier circuits 44(1) through 44(m/2) and the column gates 45(1) through 45(m/2), are coupled to sources of a memory cell 10(1, 1) to a memory cell 10 (n, 1) and a memory cell 10 (1, 2) to a memory cell (n, 2) through sources of a memory cell 10(1, m-1) to a memory cell 10 (n, m-1) and a memory cell 10 (1, m) to a memory cell (n, m). An OR logic of an OR logic of word lines WL1, WL2 and a pre-charge signal NPR through an OR logic of an OR logic of word lines WLm-1, WLm and the pre-charge signal NPR are inputted to the sense amplifier circuits 44(1) through 44(m/2) by means of NOR gates 47(1) through 47(m/2), inverters 48(1) through 48(m/2), NOR gates 49(1) through 49(m/2), and inverters 50(1) through 50(m/2).

In the above-described configuration, the source(s) of the memory cell array(s) including the selected memory cell(s) is/are controlled to "L" level, while the source(s) of all the non-selected memory cell array(s) is/are controlled to "H" level. Thus, since the off leak current of the non-selected memory cell array(s) can be suppressed with a small-size circuit configuration, a high speed access due to a high speed charging of the bit lines is enabled with a small area.

It should be noted that, similarly to the normal bit lines, the source control lines BLS1 through BLSm/2 form a memory cell pattern for a memory cell array, and can adjust timing in accordance with the number of the coupled memory cells.

Furthermore, although the number of the source potential control circuits is half the number of the memory cells coupled to the same bit line in the present embodiment, the number of the source potential control circuits to be provided may alternatively be equal to the number of the memory cells coupled to the same bit line.

Figure 7:
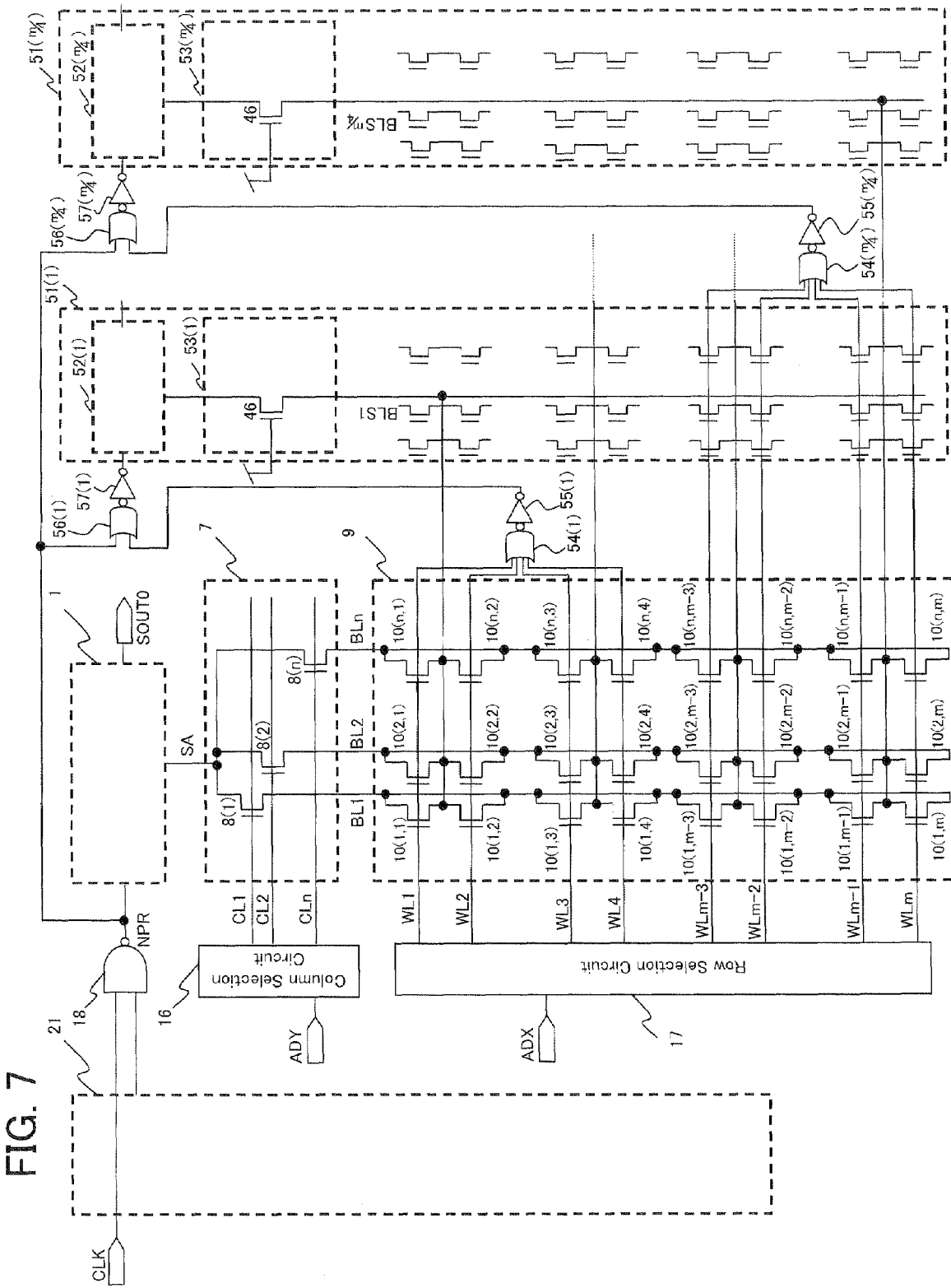
FIG. 7 is a circuit diagram showing a configuration of a read circuit of a mask ROM in Embodiment 6 of the present invention.

A semiconductor memory device according to Embodiment 6 of the present invention will be described with reference to FIG. 7. FIG. 7 is a circuit diagram showing a configuration of a read circuit of a mask ROM in Embodiment 6. In FIG. 7, the constituent elements denoted by the same reference characters as those in FIG. 5 function similarly, and therefore, only different constituent elements will be described below.

Source potential control circuits 51(1) through 51(m/4) include: sense amplifier circuits 52(1) through 52(m/4) each configured similarly to a sense amplifier circuit 1; and column gates 53(1) through 53(m/4) each configured similarly to a column gate 7. Nodes BLS1 through BLSm/4, controlled by the sense amplifier circuits 52(1) through 52(m/4) and the column gates 53(1) through 53(m/4), are coupled to sources of a memory cell 10(1, 1), a memory cell 10 (1, 2), a memory cell 10 (1, 3) and a memory cell (1, 4) through sources of a memory cell 10(n, m-3), a memory cell 10 (n, m-2), a memory cell 10 (n, m-1) and a memory cell (n, m). An OR logic of an OR logic of word lines WL1, WL2, WL3, WL4 and a pre-charge signal NPR through an OR logic of an OR logic of word lines WLm-3, WLm-2, WLm-1, WLm and the pre-charge signal NPR are inputted to the sense amplifier circuits 52(1) through 52(m/4) by means of NOR gates 54(1) through 54(m/4), inverters 55(1) through 55(m/4), NOR gates 56(1) through 56(m/4), and inverters 57(1) through 57(m/4).

In the above-described configuration, the source(s) of the memory cell array(s) including the selected memory cell(s) is/are controlled to "L" level, while the source(s) of all the non-selected memory cell array(s) is/are controlled to "H" level. Thus, since the off leak current of the non-selected memory cell array(s) can be suppressed with a small-size circuit configuration, a high speed access due to a high speed charging of the bit lines is enabled with a small area.

It should be noted that, similarly to the normal bit lines, the source control lines BLS1 through BLSm/4 form a memory cell pattern for a memory cell array, and can adjust timing in accordance with the number of the coupled memory cells.

INDUSTRIAL APPLICABILITY

A semiconductor memory device according to the present invention has the effects of suppressing the off leak current of a dummy memory cell and ensuring an appropriate timing margin in a read operation, for example, and is thus useful for a mask ROM and the like. Furthermore, another semiconductor memory device according to the present invention has the effects of suppressing the off leak current of a memory cell and realizing a high speed access in a read operation, for example, and is thus useful for a mask ROM and the like.

What is claimed is:
1. A semiconductor memory device comprising:
a first memory cell array provided by arranging a plurality of first memory cells for a memory capacity along a bit line direction and along a word line direction;

a column selection circuit and a row selection circuit for selecting, in response to an address input, a first bit line and a word line of the first memory cell array, respectively;

a first bit line charge circuit for charging the first bit line selected by the column selection circuit;

a second memory cell array having second memory cells arranged along the bit line direction of the first memory cell array, and having a second bit line to which drains and sources of the second memory cells are commonly coupled; and a second bit line charge circuit for charging the second bit line of the second memory cell array, wherein:

the number of bits of the second memory cell array is a half of that of the first memory cell array.

2. A semiconductor memory device comprising:

a first memory cell array provided by arranging a plurality of first memory cells for a memory capacity in a matrix along a bit line direction and along a word line direction;

a column selection circuit and a row selection circuit for selecting, in response to an address input, a first bit line and a word line of the first memory cell array, respectively;

a first bit line charge circuit for charging the first bit line selected by the column selection circuit;

a second memory cell array having a group of at least two second bit lines and having a plurality of second memory cells arranged along a direction of the second bit line group, the second memory cells each having a drain coupled to at least one second bit line of the second bit line group, a source coupled to the other second bit line of the second bit line group, and a gate to which a predetermined voltage is applied;

a second bit line charge circuit for charging the bit line to which the drains of the second memory cell array are coupled; and a third bit line charge circuit for charging the bit line to which the sources of the second memory cell array are coupled, wherein the first bit line of the first memory cell array, the bit line to which the drain of the second memory cell array are coupled, and the bit line to which the sources of the second memory cell array are coupled are charged substantially simultaneously.

3. The semiconductor memory device according to claim 2, wherein the second memory cells are arranged along one bit line of the second bit line group and another bit line of the second bit line group in the second memory cell array, the number of the memory cells coupled to said another bit line of the second bit line group coupled to the sources of the memory cells arranged along said one bit line of the second bit line group being equal to or less than the number of the memory cells arranged along said one bit line.

* * * * *